(12) United States Patent
Zhu et al.

(10) Patent No.: US 11,239,307 B2
(45) Date of Patent: Feb. 1, 2022

(54) METAL-OXIDE-METAL CAPACITOR FROM SUBTRACTIVE BACK-END-OF-LINE SCHEME

(71) Applicant: QUALCOMM Incorporated, San Diego, CA (US)

(72) Inventors: John Jianhong Zhu, San Diego, CA (US); Ye Lu, San Diego, CA (US); Junjing Bao, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 16/866,316

(22) Filed: May 4, 2020

(65) Prior Publication Data

US 2021/0343830 A1 Nov. 4, 2021

(51) Int. Cl.
*H01L 23/522* (2006.01)
*H01L 49/02* (2006.01)
*H01L 21/768* (2006.01)

(52) U.S. Cl.
CPC .......... *H01L 28/65* (2013.01); *H01L 21/768* (2013.01); *H01L 23/5223* (2013.01); *H01L 23/5226* (2013.01)

(58) Field of Classification Search
CPC ... H01L 28/65; H01L 21/768; H01L 23/5223; H01L 23/5226
USPC .......................................... 257/288
See application file for complete search history.

(56) References Cited

U.S. PATENT DOCUMENTS

| 8,138,539 | B2* | 3/2012 | Barth | H01L 23/5223 257/307 |
| 8,569,820 | B2* | 10/2013 | Barth | H01L 23/5223 257/307 |
| 2003/0030099 | A1* | 2/2003 | Hsieh | H01L 29/511 257/315 |
| 2009/0141424 | A1* | 6/2009 | Barth | H01L 23/5223 361/311 |
| 2010/0001370 | A1* | 1/2010 | Sheng | H01L 28/91 257/532 |

* cited by examiner

*Primary Examiner* — Tu-Tu V Ho
(74) *Attorney, Agent, or Firm* — Patterson & Sheridan, L.L.P.

(57) ABSTRACT

Certain aspects of the present disclosure generally relate to a metal-oxide-metal (MOM) capacitor formed from a subtractive back-end-of-line (BEOL) scheme. One example method of fabricating a semiconductor device generally includes forming an active layer and forming a capacitive element above the active layer with a back-end-of-line subtractive process for conductive materials.

20 Claims, 7 Drawing Sheets

METAL-OXIDE-METAL CAPACITOR FROM SUBTRACTIVE BACK-END-OF-LINE SCHEME

BACKGROUND

Field of the Disclosure

Certain aspects of the present disclosure generally relate to electronic devices and, more particularly, to a metal-oxide-metal capacitor formed from a back-end-of-line subtractive process.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices.

The ICs may include various layers of conductors (e.g., metal layers) disposed between layers of dielectric material, which are formed during a back-end-of-line (BEOL) fabrication process and disposed above active layers of the ICs. The conductors facilitate electrical wiring between various electrical components including transistors, amplifiers, inverters, control logic, memory, power management circuits, buffers, filters, resonators, capacitors, inductors, resistors, etc. The conductors may also be used to create certain passive electrical devices, such as metal-oxide-metal (MOM) capacitors.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include a desirable capacitance density for a metal-oxide-metal (MOM) capacitor.

Certain aspects of the present disclosure provide a method of fabricating a semiconductor device. The method generally includes forming an active layer and forming a capacitive element above the active layer with a back-end-of-line subtractive process for conductive materials.

Certain aspects of the present disclosure provide a semiconductor device. The semiconductor device generally includes an active layer and a capacitive element disposed above the active layer, wherein the capacitive element includes at least one conductive finger having a height spanning across at least a metal layer and a via layer disposed above the metal layer.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
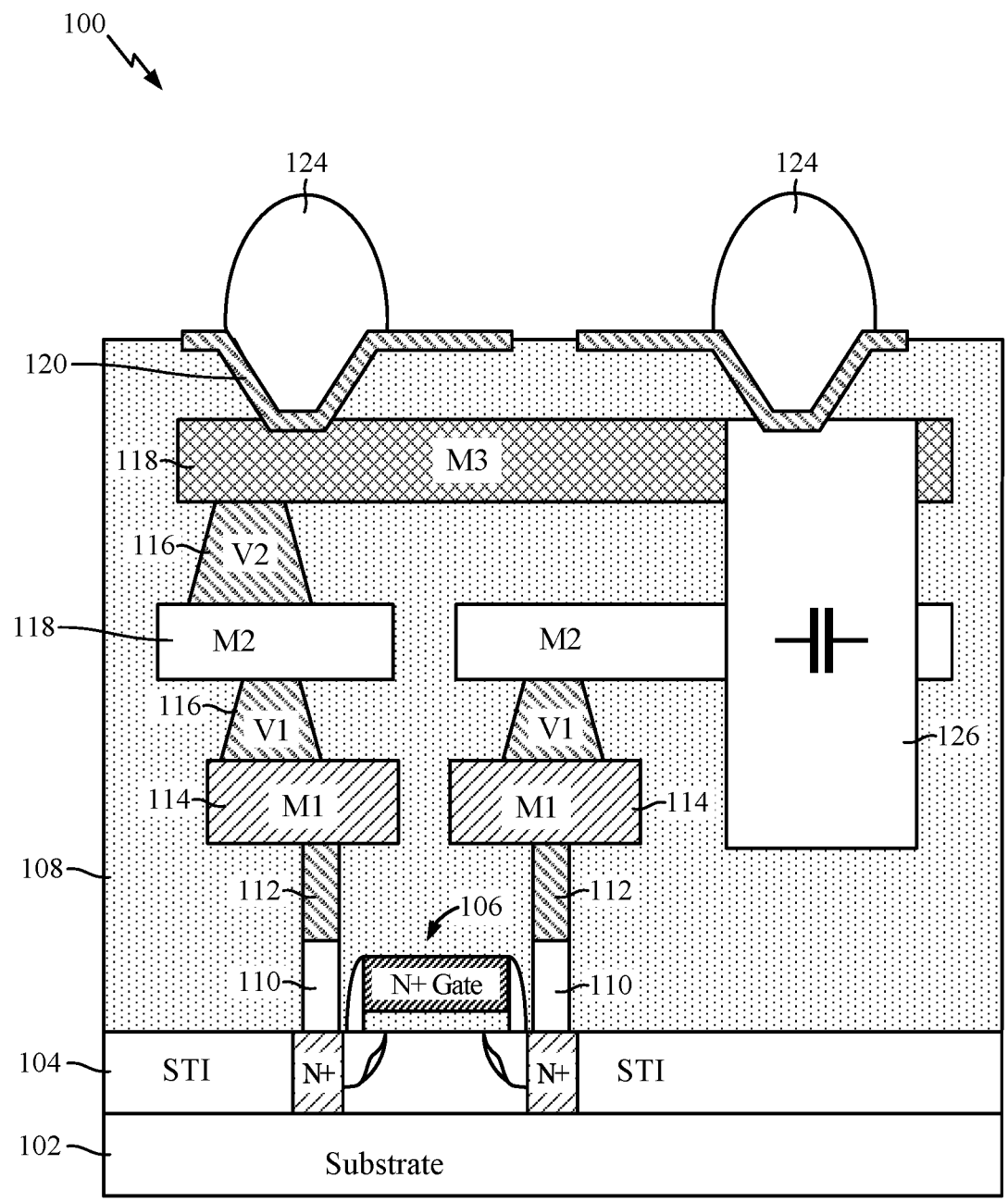
FIG. 1 illustrates a cross-sectional view of an example semiconductor device, in accordance with certain aspects of the present disclosure.

Certain aspects of the present disclosure relate to a metal-oxide-metal (MOM) capacitor and a method of fabricating a semiconductor device with a MOM capacitor.

In the micro-electronic technology industry, there is a continuous demand and evolution of processes, technologies, and assembly methodologies to design and implement smaller, more efficient integrated circuits. In certain cases, back-end-of-line (BEOL) fabrication processes may use a damascene scheme to form metallization layers and conductive vias. In aspects, the BEOL fabrication process may take place after front-end-of-line (FEOL) fabrication processes, when active electrical devices (e.g., transistors) are patterned on a substrate (e.g., a silicon wafer). For example, the BEOL fabrication process may involve various passive electrical devices (e.g., resistors, capacitors, and/or inductors) being formed above the active electrical devices and the various electrical devices (active and/or passive) being electrically interconnected. As integrated circuits are scaled down, a subtractive scheme may be used to form metallization layers and conductive vias in the BEOL fabrication processes. Under a subtractive scheme, a metal line, having a height that spans at least a metal layer and a via layer, may be patterned above one or more active layers (e.g., transistor layers), and a self-aligned metal etch or other suitable removal process may be used to remove (e.g., etch out) portions of the metal line, resulting in one or more vias being formed from the metal line.

In certain cases, capacitors may be embedded in a semiconductor die above the active layers to provide a local storage of charge within the semiconductor die. For example, MOM capacitors exploit the effect of capacitive coupling (intra-layer coupling and/or inter-layer coupling) between conductive plates (e.g., interdigitated conductive fingers) separated by a dielectric material, such as the inter-layer dielectric used in BEOL fabrication. The conductive plates or fingers may be formed from the metallization wiring layers and vias during the BEOL fabrication process. In certain cases, MOM capacitors may be used in advanced logic or radio frequency (RF) circuits. Under a conventional damascene scheme, the interdigitated fingers of a MOM capacitor are formed from a metallization layer, which has a limited height, or a mesh of vias and metallization layers. Thus, MOM capacitors formed under the damascene scheme may provide an undesirable capacitance density and impact circuit performance due to the limited area available for parallel plates.

Certain aspects of the present disclosure generally relate to a MOM capacitor formed using a BEOL subtractive process. Under the subtractive process, the interdigitated fingers of the MOM capacitor may continuously span at least the height of a metallization layer and via layer, and in certain cases, the fingers may span multiple metallization layers and via layers. As the capacitance of a capacitor is proportional to the area of the parallel plates, the capacitor plates may provide a desirable capacitance density compared to a MOM capacitor formed under a damascene process. In aspects, the MOM capacitor and fabrication process described herein may provide a desirable capacitance density and circuit performance for various semiconductor devices.

FIG. 1 is a cross-sectional view of an example semiconductor device 100, in which certain aspects of the present disclosure may be practiced. As shown, the semiconductor device 100 may include a substrate 102, a dielectric region 104, an active electrical device 106 (e.g., a transistor), a dielectric region 108, local conductive interconnects 110 (e.g., source-drain conductive contacts, which are often abbreviated as CA), first conductive vias 112, and a first layer of conductive traces 114 (e.g., metal layer one M1). In certain aspects, the semiconductor device 100 may include additional layers of conductive vias 116 (e.g., via layer one V1 and via layer two V2, also referred to as "dielectric layers"), additional layers of conductive traces 118 (e.g., metal layer two M2 and metal layer three M3), under-bump conductive pads 120, and solder bumps 124. The semiconductor device 100 may also include a capacitive element 126, which is formed with a BEOL subtractive process as further described herein with respect to FIGS. 4A-6C. For other aspects, the capacitive element may be formed directly above the active electrical device 106.

The substrate 102 may be, for example, a portion of a semiconductor wafer, such as a silicon wafer. The dielectric region 104 may be disposed above the substrate 102. The dielectric region 104 may comprise an oxide, such as silicon dioxide ($SiO_2$). In aspects, the dielectric region 104 may be a shallow trench isolation (STI) region configured to electrically isolate the active electrical device 106 from other electrical components, such as other electrical devices.

The active electrical device 106 may be disposed above the substrate 102. In this example, the active electrical device 106 may include one or more transistors, such as metal-oxide-semiconductor field-effect transistors (MOSFETs). In aspects, the MOSFETs may include fin field-effect transistors (finFETs) and/or gate-all-around (GAA) FETs. In certain aspects, the active electrical device 106 may be an inverter, amplifier, and/or other suitable electrical devices comprising transistors. The local conductive interconnects 110 may be electrically coupled to the active electrical device 106 (and may be considered as metal layer zero M0 in certain aspects). For example, the source and/or drain of the active electrical device 106 may be electrically coupled to the local conductive interconnects 110, which are electrically coupled to the first conductive vias 112. In certain aspects, the active electrical device 106 (and the local interconnects 110) may be formed during a front-end-of-line (FEOL) fabrication process.

The first conductive via 112, additional layers of conductive vias 116, and layers of conductive traces 114, 118 may be disposed above electrical components (e.g., the active electrical device 106) and formed during a back-end-of-line (BEOL) fabrication process (e.g., a subtractive process) of the semiconductor device 100. In aspects, the first conductive via 112, additional layers of conductive vias 116, and layers of conductive traces 114, 118 may be embedded in the dielectric region 108. The dielectric region 108 may comprise an oxide, such as silicon dioxide. The first conductive vias 112, additional layers of conductive vias 116, and layers of conductive traces 114, 118 provide electrical routing between the active electrical device 106 and other electrical components (not shown), including, for example, capacitors, inductors, resistors, an integrated passive device, a power management integrated circuit (PMIC), a memory chip, etc.

In this example, the semiconductor device 100 may be a flip-chip ball grid array (FC-BGA) integrated circuit having multiple solder bumps 124 electrically coupled to the under-bump conductive pads 120. In certain cases, the semiconductor device 100 may have conductive pillars (e.g., copper (Cu) pillars) that electrically couple the semiconductor device 100 to a package substrate, an interposer, or a circuit board, for example.

Figure 2A:
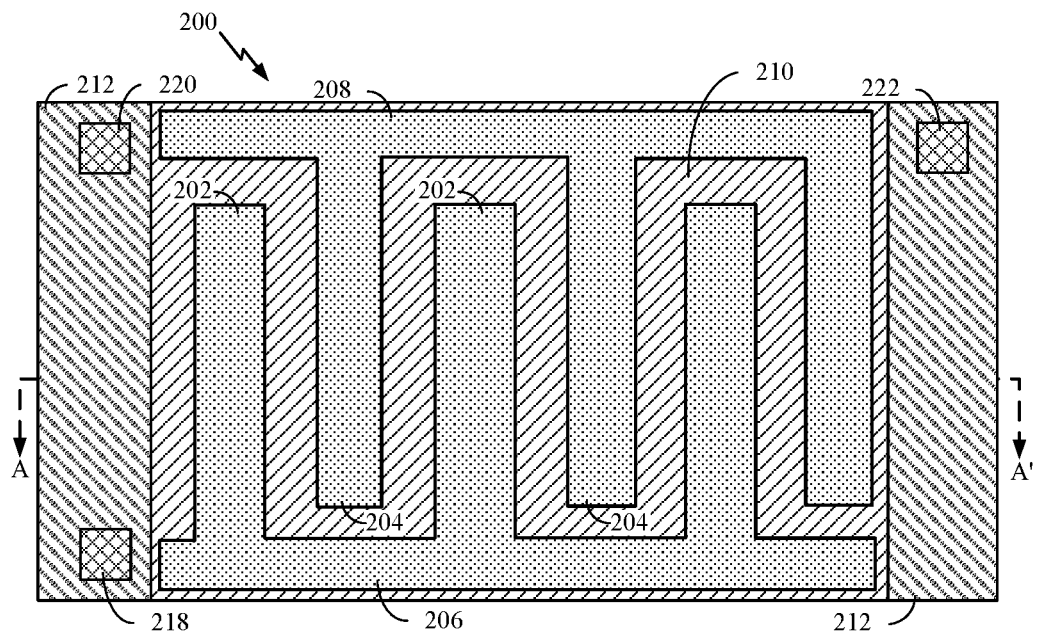
FIGS. 2A and 2B illustrate cross-sectional views of an example metal-oxide-metal (MOM) capacitor adjacent to at least one routing metal line, in accordance with certain aspects of the present disclosure.
Figure 2B:
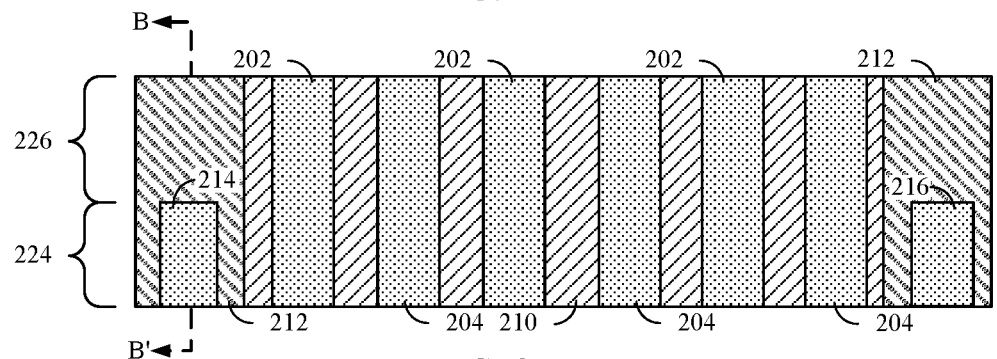
Figure 2C:
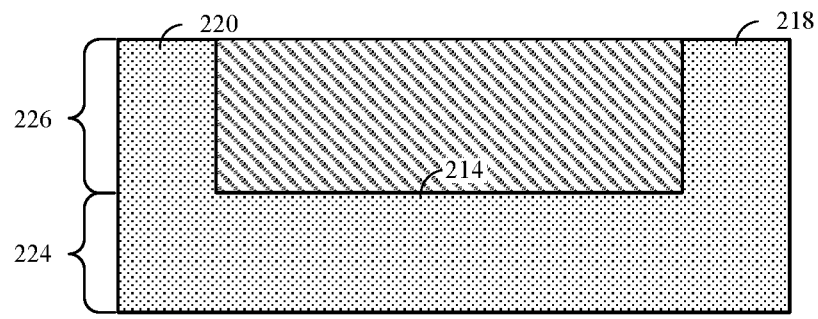
FIG. 2C illustrates a cross-sectional view of one of the routing metal lines of FIG. 2A with two vias, in accordance with certain aspects of the present disclosure.

In certain aspects, the capacitive element 126 may be a MOM capacitor, which has interdigitated conductive fingers that span the height of at least one layer of conductive traces 114 (e.g., M1) and one of the additional layers of conductive vias 116 (e.g., V1), for example, as further described herein with respect to FIGS. 2A, 2B, and 2C. In aspects, the capacitive element 126 may have fingers that span multiple metallization layers (e.g., M1, M2, and M3) and/or via layers (e.g., V1 and V2).

Example MOM Capacitor

FIG. 2A depicts a top view of an example MOM capacitor 200, which is adjacent to at least one routing metal line, in accordance with certain aspects of the present disclosure. The MOM capacitor 200 includes first fingers 202, second fingers 204, first electrode 206, second electrode 208, and a first dielectric material 210. The MOM capacitor 200 may be embedded in a semiconductor die such as the capacitive element 126 of FIG. 1. In certain cases, a second dielectric material 212 may be disposed adjacent to the first dielectric material 210 of the MOM capacitor 200.

In aspects, the first and second fingers 202, 204 may be interdigitated conductive fingers, which are coupled to the first and second electrodes 206, 208, respectively. As used herein, the term "finger" refers to a conductive element that is interdigitated (vertically or horizontally) with another conductive element. The fingers 202, 204 may be interdigitated in one or more horizontal layers (e.g., M1 and V1).

The fingers 202, 204 may include an electrically conductive material that can be formed with a subtractive process. In other words, the fingers 202, 204 may be made of a conductive material conducive to subtractive fabrication (e.g., reactive ion etching) without containing copper or a copper alloy, which is not nearly as conducive to subtractive fabrication. For example, the fingers 202, 204 may include ruthenium (Ru), cobalt (Co), rhodium (Rh), nickel (Ni), aluminum (Al), molybdenum (Mo), tungsten (W), or a combination thereof.

The first dielectric material 210 may be disposed between the fingers 202, 204. In certain cases, the first dielectric material 210 may be a different dielectric material than the dielectric material used for the dielectric region of the semiconductor die. For example, the first dielectric material 210 may include a dielectric material (e.g., hafnium dioxide ($HfO_2$), zirconium dioxide ($ZrO_2$), titanium dioxide ($TiO_2$), strontium titanate ($SrTiO_3$), barium strontium titanate ($BaO_4SrTi$), barium titanate ($BaTiO_3$), calcium copper titanate ($CaCuTiO_2$)) with a dielectric constant ($\kappa$) higher than silicon dioxide ($SiO_2$) (e.g., $\kappa=3.9$). In some aspects, the first dielectric material 210 may be referred to as a high-$\kappa$ dielectric. As the capacitance of the MOM capacitor may be proportional to the dielectric constant ($\kappa$) of the material disposed between the fingers (202, 204), the first dielectric material 210 may be configured to provide a desirable capacitance density of the MOM capacitor 200.

At least one routing metal line may be disposed adjacent to the MOM capacitor 200 along the same metal layer as the MOM capacitor as further described herein with respect to FIG. 2B, which depicts a cross-sectional view along the line A-A' of FIG. 2A. For example, as shown in FIG. 2B, a first routing metal line 214 may be disposed adjacent to one side of the MOM capacitor 200, and a second routing metal line 216 may be disposed adjacent to the opposite side of the MOM capacitor 200. First and second conductive vias 218, 220 may be disposed above and electrically coupled to the first routing metal line 214. A third conductive via 222 may be disposed above and electrically coupled to the second routing metal line 216.

In aspects, the fingers 202, 204 may have a height that spans across at least a metal layer 224 (e.g., M1 of FIG. 1) and a via layer 226 (e.g., V1 of FIG. 1), for example, as depicted with respect to FIG. 2B. In aspects, the via layer 226 may be disposed above the metal layer 224. While the example depicted in FIG. 2B is described herein with respect to the interdigitated fingers spanning a single metal layer and a single via layer to facilitate understanding, aspects of the present disclosure may also be applied to the fingers spanning vertically across multiple metal layers and/or multiple via layers, which may increase the capacitance of the MOM capacitor.

In aspects, the conductive vias 218, 220, 222 may be integrated with the routing metal lines 214, 216 due to the subtractive fabrication process used to form the conductive vias as further described herein. That is, the subtractive process may fabricate a monolithic metal structure comprising a routing metal line and one or more conductive vias. As an example, FIG. 2C depicts a cross-sectional view of the first routing metal line 214 along the line B-B' of FIG. 2B.

As shown, the first and second conductive vias 218, 220 may be integrated with the first routing metal line 214.

While the examples depicted in FIGS. 2A and 2B are described herein with respect to a MOM capacitor with interdigitated fingers to facilitate understanding, aspects of the present disclosure may also be applied to various other forms of MOM capacitors configured to increase the vertical or horizontal surface areas of parallel plates or fingers.

Figure 3A:
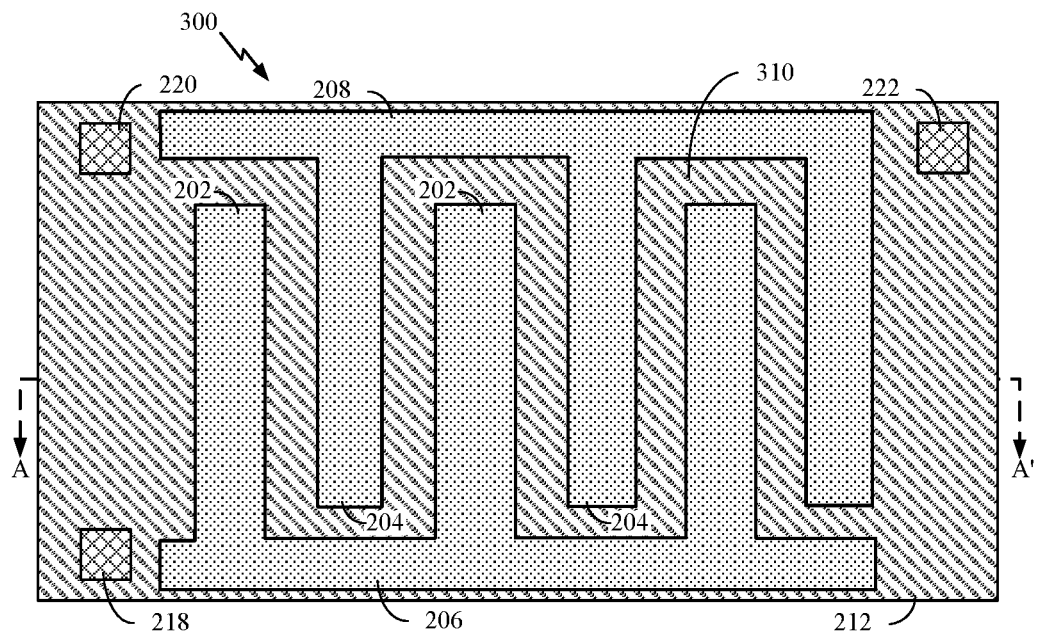
FIGS. 3A and 3B illustrate cross-sectional views of another example metal-oxide-metal (MOM) capacitor adjacent to at least one routing metal line, in accordance with certain aspects of the present disclosure.
Figure 3B:
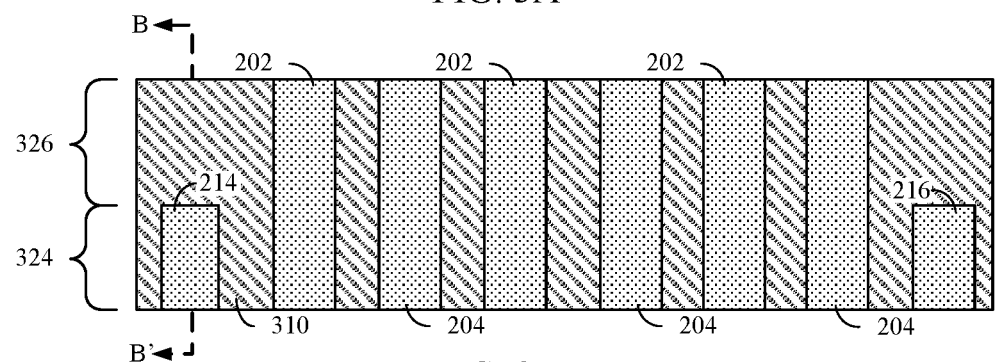
Figure 3C:
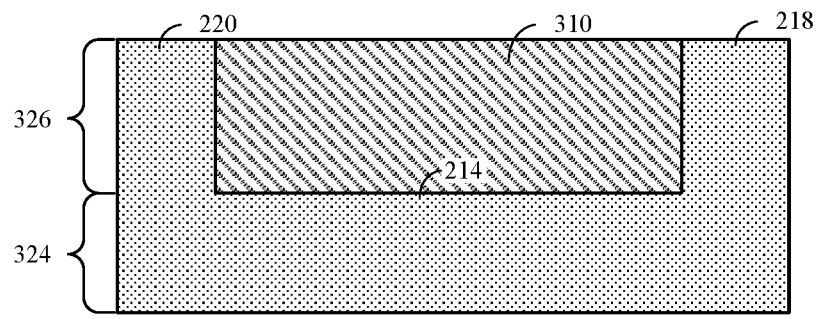
FIG. 3C illustrates a cross-sectional view of one of the routing metal lines of FIG. 3A with two vias, in accordance with certain aspects of the present disclosure.

In certain aspects, the first dielectric material 210 may be the same dielectric material used for the dielectric region of the semiconductor die (e.g., the dielectric region 108 of FIG. 1). That is, the first dielectric material 210 may be the same dielectric material as the second dielectric material 212. FIGS. 3A-3C are complementary to FIGS. 2A-2C and depict an example of the MOM capacitor 300 and routing metal lines 214, 216 embedded in the same dielectric material 310, in accordance with certain aspects of the present disclosure.

FIGS. 4A-6C illustrate example operations for fabricating a MOM capacitor with a BEOL subtractive process for conductive materials, in accordance with certain aspects of the present disclosure. FIGS. 4A-6C illustrate various cross-sectional view of the layers making up an example MOM capacitor. The operations may be performed by an integrated circuit fabrication facility, for example. The operations may include various BEOL processes, when passive electrical devices (such as a MOM capacitor) may be formed, and when electrical devices (e.g., active and passive electrical devices) are electrically interconnected through conductive elements such as metallization layers and conductive vias.

Figure 4A:
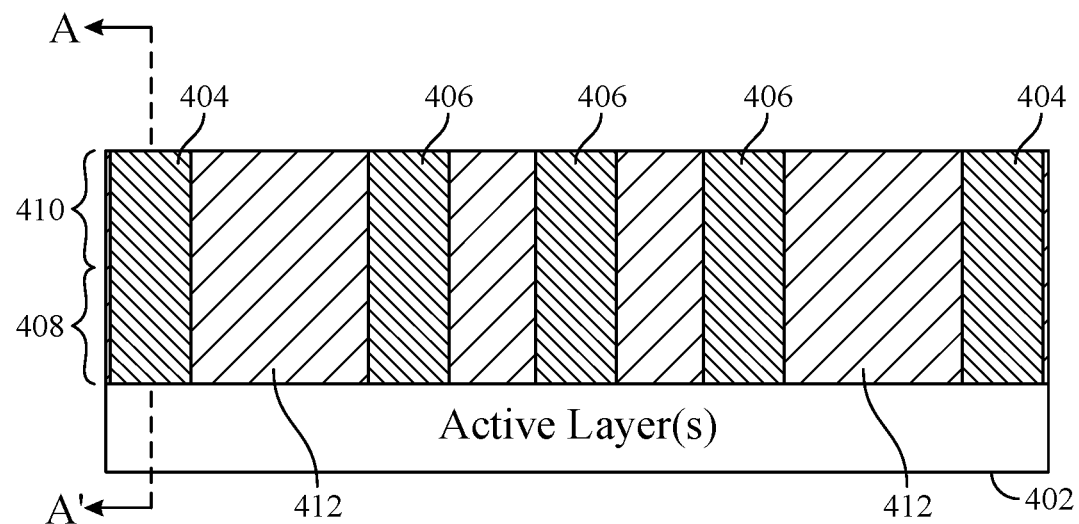
FIGS. 4A-6C illustrate example operations for fabricating a semiconductor device with a MOM capacitor, in accordance with certain aspects of the present disclosure.

As shown in FIG. 4A, one or more active layers 402 may be formed on a substrate (not shown) during a FEOL fabrication process. For example, various active electrical devices (such as the active electrical device 106 of FIG. 1) may be patterned on a substrate such as a silicon wafer. In certain aspects, the active layers 402 may include various GAA-FETs and/or finFETs.

After the active layers 402 are formed, first conductive elements 404 and second conductive elements 406 may be formed above the active layers 402. The conductive elements 404, 406 may be selectively patterned above the active layers 402 from a layer of conductive material (not shown). For example, a layer of conductive material may be formed above the active layers 402, and portions of the conductive material may be removed (e.g., using an etching process). The remaining conductive material may form the conductive elements 404, 406. In aspects, the first conductive elements 404 may provide the conductive material to form routing metal lines and/or conductive vias, such as the first routing metal line 214 and the conductive vias 218, 220 of FIGS. 2A and 2C.

The second conductive elements 406 may be patterned in the form of interdigitated fingers and electrodes (such as the fingers 202, 204 and electrodes 206, 208 of FIG. 2A). That is, the second conductive elements 406 may be formed in a pattern of interdigitated conductive fingers coupled to electrodes. As illustrated, the second conductive elements 406 may represent the cross-section of the fingers of a MOM capacitor, while the electrodes (not shown) of the MOM capacitor may also be patterned from the second conductive elements. In certain cases, the second conductive elements 406 may be spaced closer together than the first conductive elements 404 to facilitate a desirable capacitance for a MOM capacitor. That is, the distance between one of the first conductive elements 406 and an adjacent second conductive element 406 may be greater than the distance between adjacent second conductive elements 406. In certain cases, the distance between adjacent second conductive elements 406 may be about 20 nanometers or less.

In aspects, the conductive elements 404, 406 may have a height spanning across at least a metal layer 408 and a via layer 410, which is disposed above the metal layer 408. In aspects, the height(s) of the metal layer 408 and/or via layer 410 may be about 20 nanometers or less. The conductive elements 404, 406 may be made of an electrically conductive material to which a subtractive process can be applied. In other words, the conductive elements 404, 406 may be a conductive material conducive to subtractive fabrication (e.g., etching) without containing copper or a copper alloy, which is not nearly as conducive to subtractive fabrication. For example, the conductive elements 404, 406 may include ruthenium (Ru), cobalt (Co), rhodium (Rh), nickel (Ni), aluminum (Al), molybdenum (Mo), tungsten (W), or a combination thereof.

A temporary material 412 may be formed between the conductive elements 404, 406. The temporary material 412 may be any suitable dummy material that is easily removed, such as polycrystalline silicon or silicon dioxide. In aspects, a planarization process (e.g., a chemical mechanical planarization (CMP) process) may be performed to level and smooth the upper surfaces of the conductive elements 404, 406 and temporary material 412.

Figure 4B:
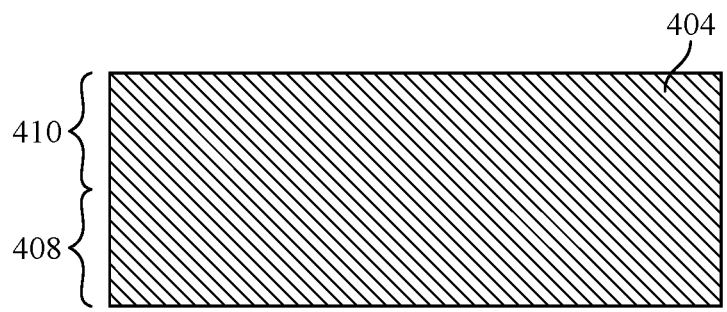

In aspects, the conductive elements 404, 406 may have a rectilinear shape. For example, FIG. 4B illustrates a cross-sectional view of one of the first conductive elements 404 along the line A-A' of FIG. 4A. In other words, the conductive elements 404, 406 may have the same height across a certain length of the conductive elements 404, 406. The lengths of the conductive elements 404, 406 may vary among the conductive elements 404, 406.

Figure 4C:
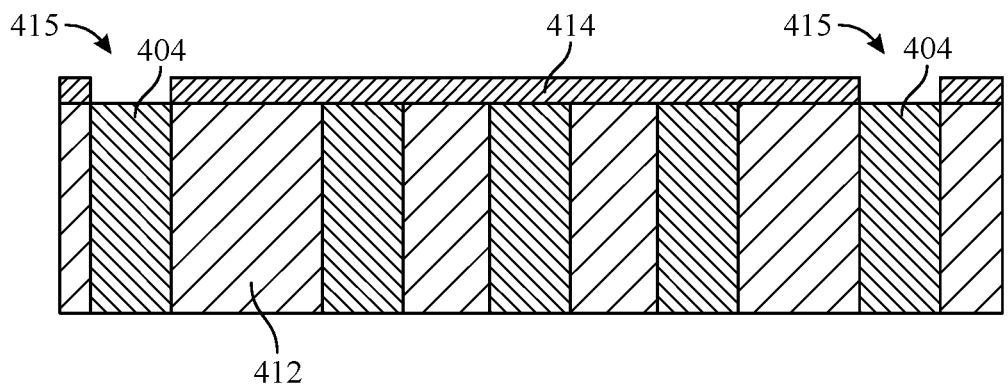

Referring to FIG. 4C, a patterning mask 414 may be formed above the temporary material 412 and portions of the conductive elements 404, 406. In aspects, the patterning mask 414 may be patterned above some of the conductive elements 404, 406 to enable a subtractive process to remove portions of the conductive elements 404, 406. That is, there may be openings 415 (or voids) in the patterning mask 414 to facilitate the etching of portions of the conductive elements 404, 406. In this example, the openings 415 in the patterning mask 414 may be formed above the first conductive elements 404. That is, one or more portions of each of the first conductive elements 404 may be exposed by the patterning mask 414 (i.e., not covered by the patterning mask 414) and removed as further described herein with respect to FIG. 5A. In aspects, the patterning mask 414 may cover the temporary material 412 and the conductive elements 404, 406 except where routing metal lines are to be formed (e.g., by etching upper portions of the conductive elements 404).

Figure 5A:
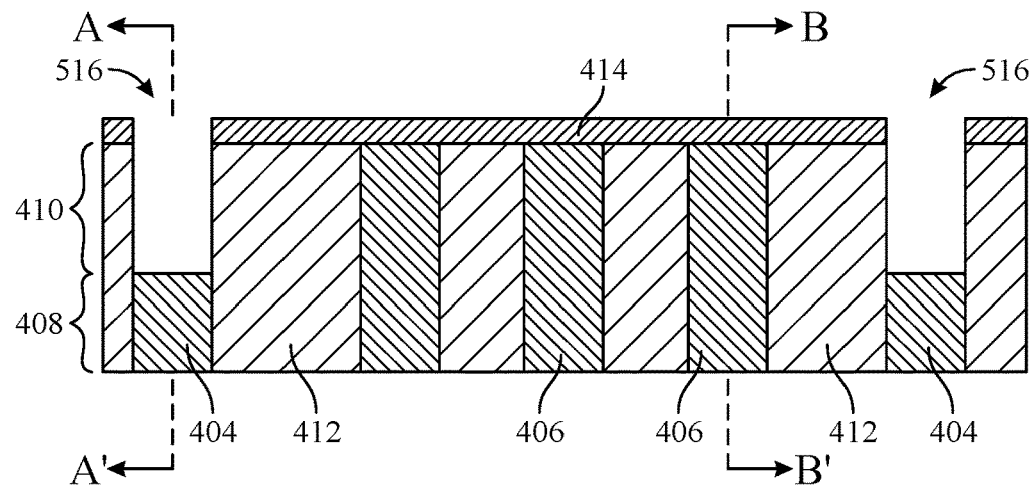
Figure 5B:
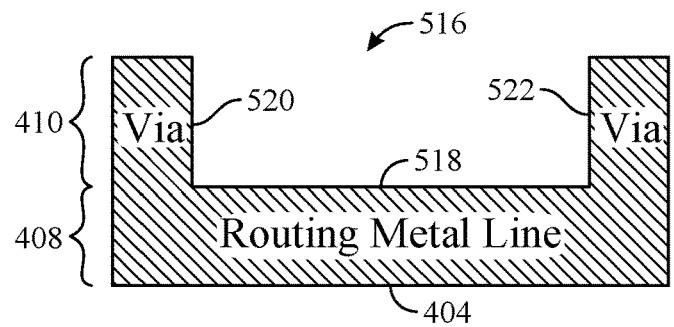

As depicted in FIG. 5A, portions of the first conductive elements 404 may be removed, for example, using a reactive ion etching (RIE) process. That is, cavities 516 may be formed in certain conductive elements to form routing metal lines in the metal layer 408 and leaving conductive vias in the via layer 410. For example, FIG. 5B illustrates a cross-sectional view of one of the first conductive elements 404 along the line A-A' of FIG. 5A. As shown in FIG. 5B, the cavity 516 may span a portion of the first conductive element 404 to form a routing metal line 518 with two conductive vias 520, 522 disposed on opposite ends of the routing metal line 518. In certain aspects, the conductive vias 520, 522 may have a width of about 10 nanometers or less. In aspects, various other via patterns may be formed depending on the electrical routing designed for the semiconductor die.

Figure 5C:
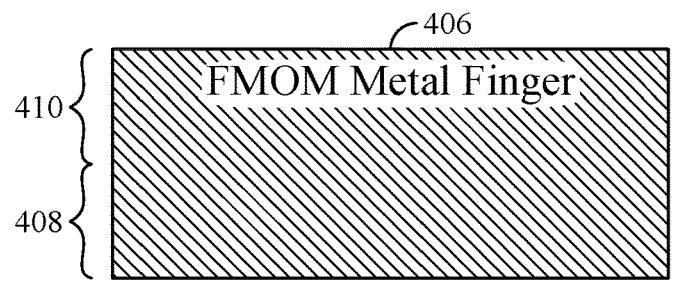

The second conductive elements 406 may not be etched such that the second conductive elements 406 (e.g., the fingers 202, 204) continue to span the height of the metal layer 408 and via layer 410, for example as described herein with respect to FIG. 2B. As an example, FIG. 5C illustrates a cross-sectional view of a second conductive element 406 along the line B-B' of FIG. 5A.

Figure 6A:
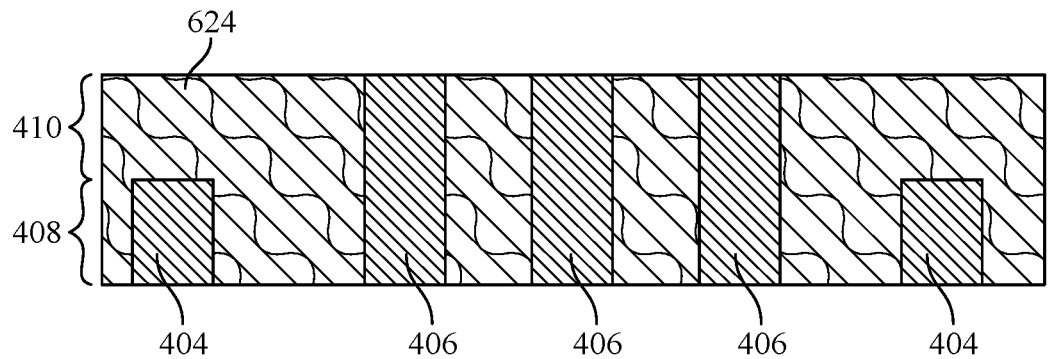
Figure 6B:
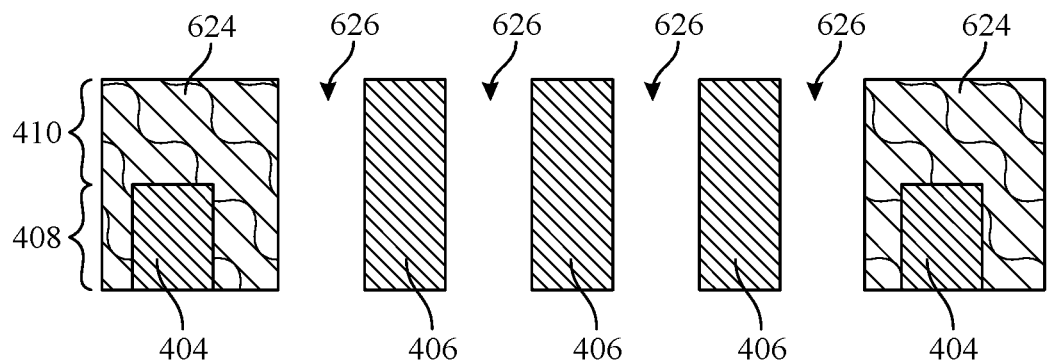

In aspects, the temporary material 412 and patterning mask 414 may be removed between the conductive elements 404, 406, and one or more dielectric materials may be formed between the conductive elements 404, 406. For example, as shown in FIG. 6A, the temporary material 412 and patterning mask 414 are removed, and a first dielectric material 624 (e.g., the second dielectric material 212 or first dielectric material 310) is formed between the conductive elements 404, 406. In aspects, a planarization process (e.g., a CMP process) may be performed to level and smooth the upper surfaces of the first dielectric material 624. In certain cases, the MOM capacitor may be left with the same dielectric material formed between the conductive elements 404, 406, for example, as described herein with respect to FIGS. 3A-3C.

Figure 6C:
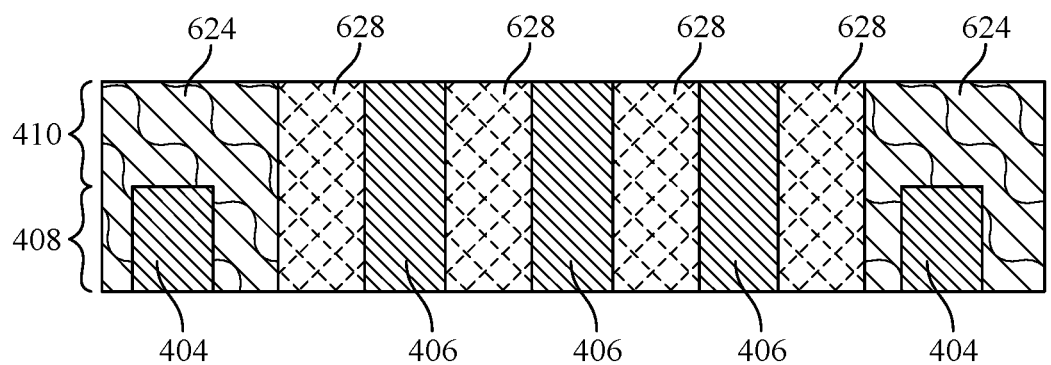

In certain cases, a high-κ dielectric may be formed between the conductive elements 406 to provide a desirable capacitance density for the MOM capacitor, for example, as described herein with respect to FIGS. 2A-2C. For example, referring to FIG. 6B, portions of the first dielectric material 624 may be removed adjacent to the conductive elements 406 to form cavities 626. As depicted in FIG. 6C, a second dielectric material 628 may be formed in the cavities 626, and a planarization process (e.g., a CMP process) may be performed to level and smooth the upper surfaces of the second dielectric material 628. In aspects, the second dielectric material 626 may be a high-κ dielectric such as the first dielectric material 210 of FIGS. 2A-2C.

In aspects, additional conductive elements may be formed above at least a portion of the conductive elements 404, 406 (such as the second conductive elements 406). For example, the height of the second conductive elements 406 may be extended by forming additional conductive elements above the second conductive elements 406 as described herein with respect to FIGS. 4A-6A. In other words, the process to form the second conductive elements may be repeated to extend the height of the fingers of a MOM capacitor.

In aspects, a conductive layer (e.g., M2 or M3 of FIG. 1) may be formed above the remaining portions of the conductive elements 404, 406, such that at least one via segment of the first conductive elements 404 is coupled to the conductive layer. In other words, the conductive layer may be formed above the conductive elements 404, 406 and electrically coupled to at least one of the conductive vias 520, 522.

Figure 7:
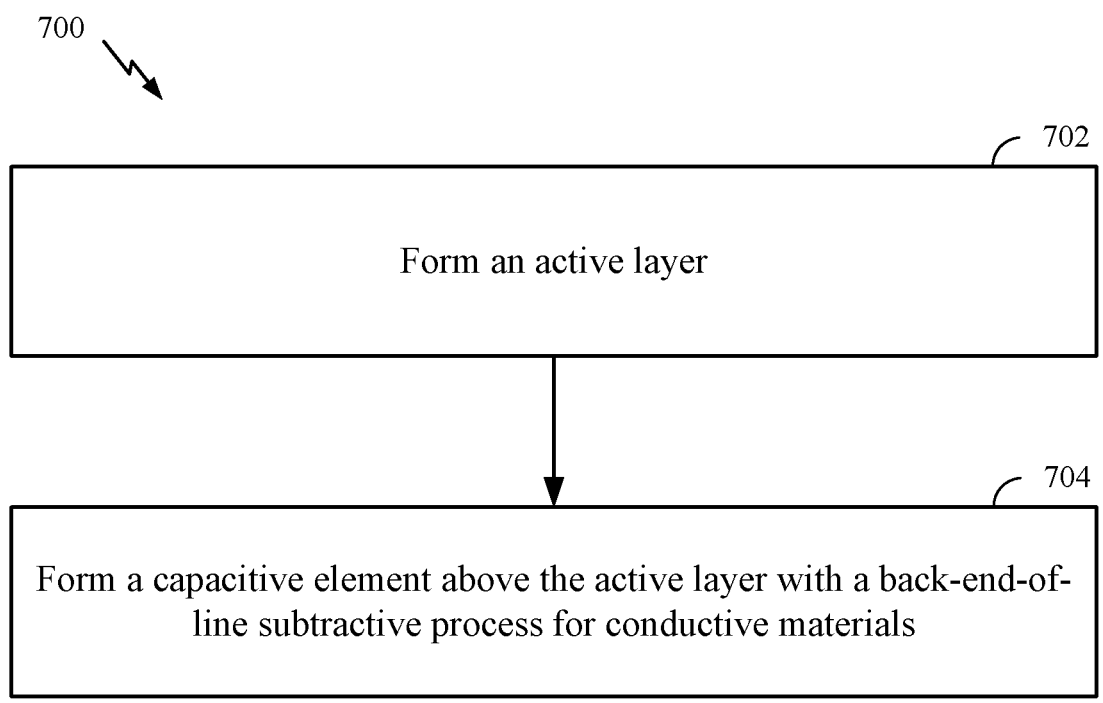
FIG. 7 is a flow diagram of example operations for fabricating a semiconductor device with a MOM capacitor, in accordance with certain aspects of the present disclosure.

FIG. 7 is a flow diagram of example operations 700 for fabricating a semiconductor device (e.g., the semiconductor device 100 depicted in FIG. 1), in accordance with certain aspects of the present disclosure. The operations 700 may be performed by an integrated circuit fabrication facility, for example.

The operations 700 begin, at block 702, by forming an active layer (e.g., the one or more active layers 402). At block 704, a capacitive element (e.g., the capacitive element 126) may be formed above the active layer with a back-end-of-line subtractive process for conductive materials (such as the operations described herein with respect to FIGS. 4A-6C).

In aspects, the capacitive element formed at block 704 is a metal-oxide-metal (MOM) capacitor (e.g., the MOM capacitor 200). In certain aspects, forming the capacitive element at block 704 may include forming conductive elements (e.g., the first and second conductive elements 404, 406) with a height spanning across a metal layer (e.g., the metal layer 408) and a via layer (e.g., the via layer 410) disposed above the metal layer and forming a dielectric material (e.g., the second dielectric material 212) between at least a portion of the conductive elements (e.g., the second conductive elements 406). The conductive elements may include ruthenium (Ru), cobalt (Co), rhodium (Rh), nickel (Ni), aluminum (Al), molybdenum (Mo), tungsten (W), or a combination thereof. In certain cases, the conductive elements may be formed in a pattern of interdigitated conductive fingers (e.g., the first and second fingers 202, 204) coupled to electrodes (e.g., the first and second electrodes 206, 208).

In aspects, the operations 700 may include forming additional conductive elements above at least a portion of the conductive elements, where the additional conductive element have a height that spans a metal layer and via layer. For example, the height of the second conductive elements 406 may be extended by forming additional conductive elements above the second conductive elements 406 as described herein with respect to FIGS. 4A-6C. In other words, the process to form the second conductive elements may be repeated to extend the height of the fingers of a MOM capacitor.

In aspects, the dielectric material formed between the conductive elements may be a high-κ dielectric, such as a dielectric material having a dielectric constant greater than silicon dioxide. For example, the operations 700 may include performing the operations described herein with respect to FIGS. 6A-6C.

The operations 700 may also include forming at least one routing metal line (e.g., the routing metal line 518) with the back-end-of-line subtractive process. The routing metal line may be disposed above the active layer and have a height spanning across the metal layer. In aspects, forming routing metal line may include removing a portion of at least one of the conductive elements (e.g., a portion of the first conductive elements 404) within the via layer. Removing a portion of the conductive elements may include performing a reactive ion etching process to remove the portion of the conductive elements.

In aspects, the routing metal line may be formed using a temporary filler material and patterning mask as described herein with respect to FIGS. 4A-5C. With respect to the operations 700, forming the routing metal line may include forming a temporary material (e.g., the temporary material 412) between the conductive elements and forming a patterning mask (e.g., the patterning mask 414) above the temporary material and portions of the conductive elements. Removing a portion of the conductive elements may include removing the portion of the at least one of the conductive elements exposed by the patterning mask (e.g., a portion that is not covered by the patterning mask). In aspects, the dielectric material between the conductive elements may be formed by removing the temporary material between the conductive elements and forming the dielectric material between at least the portion of the conductive elements, after removing the temporary material.

In certain cases, after removing a portion of the conductive elements, the remaining portion of the conductive elements may form a routing metal line with an integrated conductive via, for example, as described herein with respect to FIG. 4B. In aspects, the operations 700 may further include forming a conductive layer (e.g., M2) above the remaining portion of the conductive elements, such that a via segment (e.g., V1) of the conductive elements is coupled to the conductive layer.

It should be appreciated that the MOM capacitor and fabrication process described herein may enable a desirable capacitance density and electrical performance of the integrated circuit package.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method of fabricating a semiconductor device, comprising:
   forming an active layer;
   forming a capacitive element above the active layer with a back-end-of-line subtractive process for conductive materials, wherein forming the capacitive element comprises:
      forming conductive elements with a height spanning across at least a metal layer and a via layer disposed above the metal layer; and
      forming a first dielectric material between at least a portion of the conductive elements; and
   forming at least one routing metal line with the back-end-of-line subtractive process, the routing metal line being disposed above the active layer and having a height spanning across the metal layer, wherein forming the at least one routing metal line comprises removing a portion of at least one of the conductive elements within the via layer.

2. The method of claim 1, wherein forming the capacitive element comprises forming a metal-oxide-metal (MOM) capacitor.

3. The method of claim 1, wherein the conductive elements comprise ruthenium (Ru), cobalt (Co), rhodium (Rh), nickel (Ni), aluminum (Al), molybdenum (Mo), tungsten (W), or a combination thereof.

4. The method of claim 1, wherein forming the conductive elements comprises forming the conductive elements in a pattern of interdigitated conductive fingers coupled to electrodes.

5. The method of claim 1, wherein forming the capacitive element further comprises forming additional conductive elements above at least a portion of the conductive elements.

6. The method of claim 1, wherein:
   the at least one routing metal line is disposed in a second dielectric material;
   the capacitive element is disposed in the first dielectric material;
   the first dielectric material and the second dielectric material have different dielectric constants; and
   the first dielectric material has a dielectric constant greater than silicon dioxide.

7. The method of claim 6, wherein the second dielectric material has a greater dielectric constant than the first dielectric material.

8. The method of claim 1, wherein removing the portion of the at least one of the conductive elements comprises removing the portion of the at least one of the conductive elements with a reactive ion etching process.

9. The method of claim 1, wherein forming the at least one routing metal line comprises:
   forming a temporary material between the conductive elements; and
   forming a patterning mask above the temporary material, wherein removing the portion of the at least one of the conductive elements comprises removing the portion of the at least one of the conductive elements exposed by the patterning mask.

10. The method of claim 9, wherein forming the first dielectric material comprises:
    removing the temporary material between the conductive elements; and
    forming the first dielectric material between at least the portion of the conductive elements, after removing the temporary material.

11. The method of claim 1, further comprising forming a conductive layer above a remaining portion of the at least one of the conductive elements, such that a via segment of the at least one of the conductive elements is coupled to the conductive layer.

12. A semiconductor device, comprising:
    an active layer;
    a capacitive element disposed above the active layer, wherein the capacitive element includes at least one conductive finger having a height spanning across at least a metal layer and a via layer disposed above the metal layer; and
    at least one routing metal line disposed adjacent to the capacitive element, wherein the at least one routing metal line is disposed in a first dielectric material, wherein the capacitive element is disposed in a second dielectric material, and wherein the first dielectric material and the second dielectric material have different dielectric constants.

13. The semiconductor device of claim 12, wherein the capacitive element is a metal-oxide-metal (MOM) capacitor embedded in the semiconductor device.

14. The semiconductor device of claim 12, wherein the at least one conductive finger comprises ruthenium (Ru), cobalt (Co), rhodium (Rh), nickel (Ni), aluminum (Al), molybdenum (Mo), tungsten (W), or a combination thereof.

15. The semiconductor device of claim 12, wherein the height of the at least one conductive finger spans across a plurality of via layers and metal layers.

16. The semiconductor device of claim 12, wherein the capacitive element has interdigitated conductive fingers, including the at least one conductive finger, coupled to electrodes and wherein the conductive fingers are interdigitated in one or more horizontal layers.

17. The semiconductor device of claim 16, wherein the second dielectric material is disposed between the conductive fingers of the capacitive element.

18. The semiconductor device of claim 17, wherein the second dielectric material has a dielectric constant greater than silicon dioxide.

19. The semiconductor device of claim 12, further comprising a conductive via disposed above and electrically coupled to the at least one routing metal line.

20. The semiconductor device of claim 12, wherein the second dielectric material has a greater dielectric constant than the first dielectric material.

* * * * *